United States Patent
Prasad et al.

(10) Patent No.: US 9,891,285 B2
(45) Date of Patent: Feb. 13, 2018

(54) BATTERY FUEL GAUGE

(71) Applicant: Texas Instruments Incorporated, Dallas, TX (US)

(72) Inventors: Githin K. Prasad, Dallas, TX (US); Yevgen Barsukov, Richardson, TX (US); Yandong Zhang, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 171 days.

(21) Appl. No.: 14/924,436

(22) Filed: Oct. 27, 2015

(65) Prior Publication Data

US 2016/0124051 A1    May 5, 2016

Related U.S. Application Data

(60) Provisional application No. 62/072,171, filed on Oct. 29, 2014.

(51) Int. Cl.
*G01N 27/416* (2006.01)
*G01R 31/36* (2006.01)

(52) U.S. Cl.
CPC ........ *G01R 31/3651* (2013.01); *G01R 31/362* (2013.01)

(58) Field of Classification Search
CPC ............ G01R 31/3648; G01R 31/3627; G01R 31/3662; G01R 31/3631; Y02E 60/12
USPC .......................................................... 324/426
See application file for complete search history.

(56) References Cited

U.S. PATENT DOCUMENTS

| | | | |
|---|---|---|---|
| 4,707,795 A * | 11/1987 | Alber ................. | G01R 31/3606 324/433 |
| 7,808,244 B2 | 10/2010 | Barsukov et al. | |
| 8,242,738 B2 | 8/2012 | Barsukov | |
| 8,450,978 B2 | 5/2013 | Barsukov et al. | |
| 2008/0238430 A1* | 10/2008 | Page ................... | G01R 27/2605 324/425 |
| 2012/0143585 A1 | 6/2012 | Barsukov et al. | |
| 2013/0141106 A1* | 6/2013 | Yang .................. | G01R 31/3658 324/426 |
| 2014/0203813 A1* | 7/2014 | Driemeyer-Franco | G01R 31/3624 324/434 |

* cited by examiner

*Primary Examiner* — Arun Williams
(74) *Attorney, Agent, or Firm* — William B. Kempler; Charles A. Brill; Frank D. Cimino

(57) ABSTRACT

A system includes a battery; an analog-to-digital converter coupled to the battery and capable of measuring an output voltage of the battery; a processor, receiving measured battery output voltages from the analog-to-digital converter; the processor using a first equivalent circuit model of the battery to estimate battery current when the battery operation is static; and the processor using a second equivalent circuit model of the battery to estimate battery current when the battery operation is dynamic.

15 Claims, 2 Drawing Sheets

BATTERY FUEL GAUGE

RELATED APPLICATION

This application claims the benefit of U.S. Provisional Application No. 62/072,171, filed Oct. 29, 2014, for "METHOD AND APPARATUS OF BATTERY FUEL GAUGING USING A NOVEL HYBRID LITHIUM ION BATTERY MODEL", for Githin Karippumannil Prasad, et al., which is incorporated herein in its entirety.

BACKGROUND

In battery powered systems it is important to have an accurate estimate of the battery's usable capacity, called State of Charge (SOC). In an analogy to automotive fuel gauges, instrumentation to estimate SOC is called a battery fuel gauge. If a battery fuel gauge overestimates SOC, then the battery might unexpectedly stop functioning, forcing a system being powered by the battery to uncontrollably shut down, which in some cases might result in catastrophic data loss. If a battery fuel gauge underestimates SOC, then a system being powered by the battery might be warned that a battery is discharged when it is actually still has charge available, resulting in an inconvenient and unnecessary shut down or recharging operation. Accordingly, fuel gauge accuracy is important.

Battery fuel gauges range from very simple to very complex. The simplest of gauges involves the method of voltage correlation, in which the SOC is determined using the strong correlation of the battery's open circuit voltage with its state of charge. However, accurate open circuit voltage values can be obtained only when the battery reaches equilibrium upon relaxation after a load, which can be very time consuming. Moreover, the battery will not reach equilibrium if it is always under load, so SOC may not be updated accurately.

Another simple gauging technique, known as Coulomb Counting, uses a current-sense resistor connected in series with the output of the battery. The voltage across the resistor is used to measure current, and the current is integrated during charging and discharging to estimate SOC. However, an external resistor wastes energy and reduces the useable supply voltage.

Another gauging approach is to model the battery as an equivalent circuit. The output voltage of the battery is monitored, current is estimated using the output voltage and the model, and the estimated current is integrated to determine an estimated change of charge. One simple equivalent circuit model (called an R model) assumes the battery is an ideal voltage source with an estimated internal resistance. The current can be estimated based on the open circuit voltage and the voltage drop resulting from current flowing through the estimated internal resistance. However, the R model does not accurately estimate the current because it does not capture the transient voltage behavior that occurs at the onset of a load change.

An improved equivalent circuit model (called an RC model) has at least one parallel resistance/capacitance circuit, with the parallel resistance/capacitance circuit in series with an additional resistance. FIG. 1 illustrates an example of an RC model 100 of a battery. In the example model, there is a voltage source 102 having a voltage $V_{OC}$, which is the steady state open source voltage of the battery. There is a series resistor $R_{SER}$. There is also a parallel circuit with a resistor $R_{PAR}$ in parallel with a capacitor $C_{PAR}$. The model circuit has an output voltage $V_{OUT}$. A processor (not illustrated) monitors $V_{OUT}$ and estimates the load current $i_{LOAD}$ using the equivalent circuit model 100. The processor integrates the estimated load current $i_{LOAD}$ to obtain an estimated amount of change in charge. An example of how $R_{SER}$, $R_{PAR}$, and $C_{PAR}$ are determined may be found in U.S. Patent Application Publication US 2012/0143585, published Jun. 7, 2012, by Barsukov et al., which is incorporated herein for all that it teaches and discloses.

The most sophisticated and most accurate models are physics based, with complex differential equations modeling a large number of electrochemical parameters. Many of the electrochemical parameters are difficult to measure, and the computational complexity may be impractical for portable real-time electronic devices.

DETAILED DESCRIPTION

The RC model improves the estimates of current during dynamic load changes, but still results in a degree of inaccuracy that is important in some systems, because the R and C parameters are a strong nonlinear function of SOC. The RC model can correctly represent the transient behavior of the battery at the onset of a load for a slight or no change in SOC. However, it cannot accurately predict the complete charge/discharge characteristics because an RC model, even with two or three parallel RC networks, does not correspond to the complex internal structure of the battery system when its parameters (resistances and capacitances) are changing with SOC, for example, during a long discharge. A more accurate load current estimation is obtained when a first model is used during static operation (that is, constant load current after a transient period or no load current) and a second model is used during dynamic operation (onset of changing load current). In addition, a more accurate result is obtained when each model has a separate transfer function for each temperature and each SOC. In one specific example embodiment, an R model is used during static operation (constant load current after an initial onset transient has subsided) and an RC model is used during dynamic operation (onset of changing load current). Accordingly, in the following example embodiment, a single resistor is used for an equivalent circuit model during static operation, and a series resistor with at least one parallel resistor and capacitor circuit is used for an equivalent circuit model during dynamic operation. This hybrid model improves precision in determining the load current by capturing the transient dynamics and the post transient behavior to give an accurate description of the entire battery discharge characteristic. The R model and RC model are just examples of different models that may be used, and other models may be used when needed by a particular transfer function at a particular temperature and SOC.

For highest accuracy, the model circuit parameters (resistor and capacitor values) vary with temperature and SOC. Accordingly, in the following example embodiment, battery temperature is optionally measured and resistance and capacitance values of the equivalent circuit models are optionally changed as a function of temperature and SOC.

Figure 1:
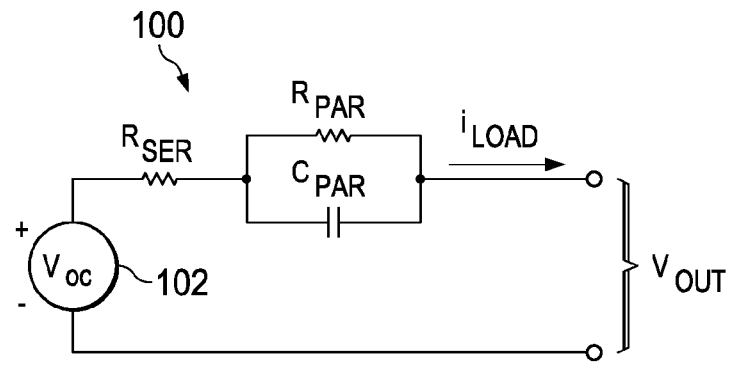
FIG. 1 is a block diagram schematic of an example embodiment of a prior art equivalent circuit model of a battery.
Figure 2:
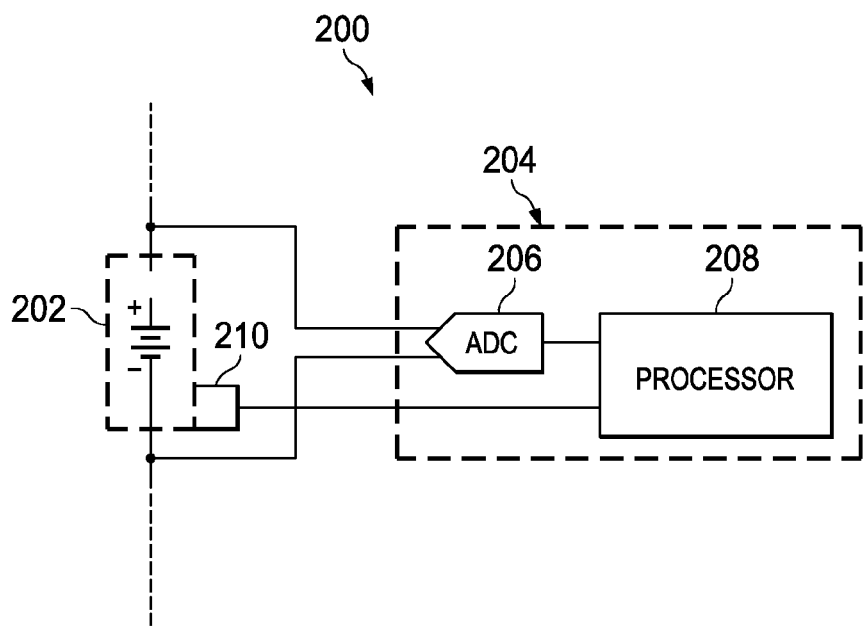
FIG. 2 is a block diagram of an example embodiment of a system that includes a battery and a battery fuel gauge.

FIG. 2 illustrates a system 200 that includes a battery 202 (depicted in the example as a stack of multiple batteries in series) and a battery fuel gauge 204. The battery fuel gauge 204 includes an Analog-to-Digital Converter (ADC) 206 that measures the output voltage of the battery 202 and converts the battery voltage to digitized voltage samples. A processor (or controller) 208 receives the digitized voltage samples, estimates current, and integrates estimated current to estimate the SOC of the battery. An optional temperature sensor 210 measures the temperature of the battery 202 and the processor 208 optionally receives digital temperature measurements. The ADC 206 and processor 208 may be part of a separate battery fuel gauge module or chip, or they may be integral parts of the system 200. For example, the processor 208 may be a processor that also controls the overall system 200. The temperature sensor 210 may be integrated into the battery 202, or it may be a separate device, or it may be part of a separate fuel gauge module. The equivalent circuit model parameters for the battery 202 may be measured as a function of temperature and SOC as a one-time measurement before manufacturing of the system 200 and the resulting values stored for use by the processor 208. The processor 208 may use a curve fit to calculate resistance and capacitance values as a function of temperature and SOC or resistance and capacitance values as functions of temperature and SOC may be stored in tables for table look-up.

Figure 3A:
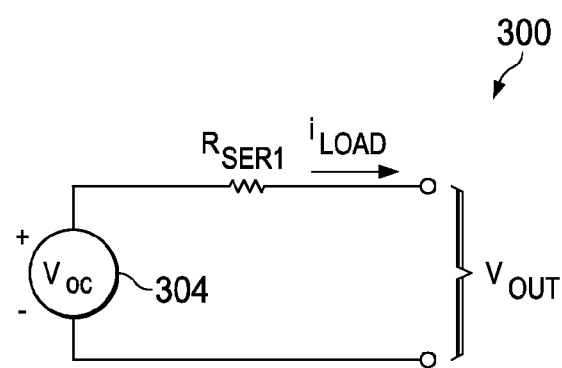
FIG. 3A is a block diagram schematic of an example embodiment of a battery equivalent circuit model used by the battery fuel gauge of FIG. 2.

FIG. 3A illustrates an example of an equivalent circuit model 300 used by the processor 208 in FIG. 2 during static operation (constant load current after a transient period or no load current). There is a voltage source 304 having a voltage $V_{OC}$, which is the steady state open source voltage of the battery, and a series resistor $R_{SER1}$. The circuit model 300 has an output load current $i_{LOAD}$ and an output voltage $V_{OUT}$. If battery temperature is measured then the circuit model 300 models $R_{SER1}$ as a function of temperature.

Figure 3B:
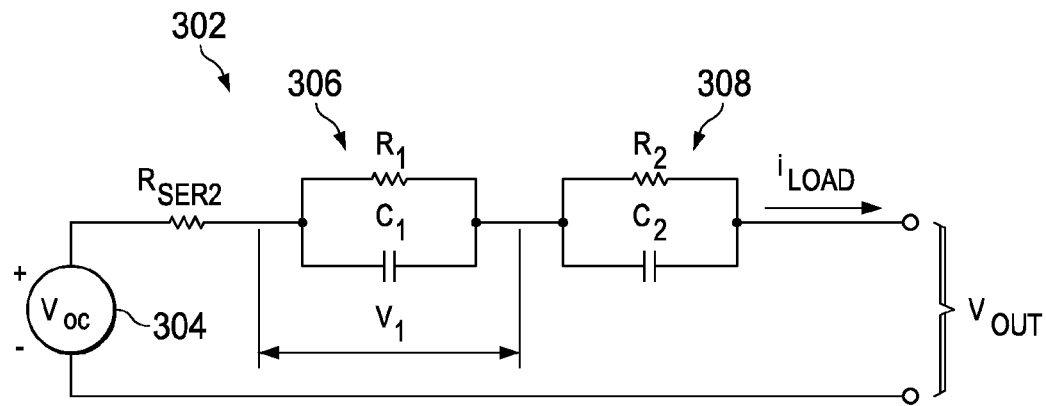
FIG. 3B is a block diagram schematic of an example embodiment of a battery equivalent circuit model used by the battery fuel gauge of FIG. 2.

FIG. 3B illustrates an example of an equivalent circuit model 302 used by the processor 208 in FIG. 2 during the dynamic phase (onset of changing load current). There is a voltage source 304 having a voltage $V_{OC}$, which is the steady state open source voltage of the battery, a series resistor $R_{SER2}$, a first parallel RC circuit 306 comprising a resistor $R_1$ in parallel with a capacitor $C_1$, and a second parallel RC circuit 308 comprising a resistor $R_2$ in parallel with a capacitor $C_2$. The circuit model 302 has an output load current $i_{LOAD}$ and an output voltage $V_{OUT}$. If battery temperature is measured then the circuit model 302 models $R_{SER2}$, $R_1$, and $R_2$ as a function of temperature. The circuit of FIG. 3B provides a more accurate model during the transient period of the battery. A single RC circuit may be used, but two RC circuits (306, 308) provide better accuracy. An example of determination of the parameters for the equivalent circuit of FIG. 3B may be found in U.S. Pat. No. 8,242,738 B2, issued Aug. 14, 2012, which is hereby incorporated by reference.

In FIG. 3B, $V_1$ is the voltage across the parallel combination of $R_1$ and $C_1$. During a transient condition voltage $V_1$ is varying and then at the end of the transient period voltage $V_1$ converges to a constant value. For one example of how the processor may determine which model to use, both models (FIG. 3A and FIG. 3B) may be computed for every measurement of $V_{OUT}$, and when $V_1$ is substantially unchanging then the model of FIG. 3A is used to estimate $i_{LOAD}$, and when $V_1$ is varying then the model of FIG. 3B is used to estimate $i_{LOAD}$. The choice of whether to measure the voltage across $R_1$ and $C_1$ or to measure the voltage across $R_2$ and $C_2$ is arbitrary.

Figure 4:
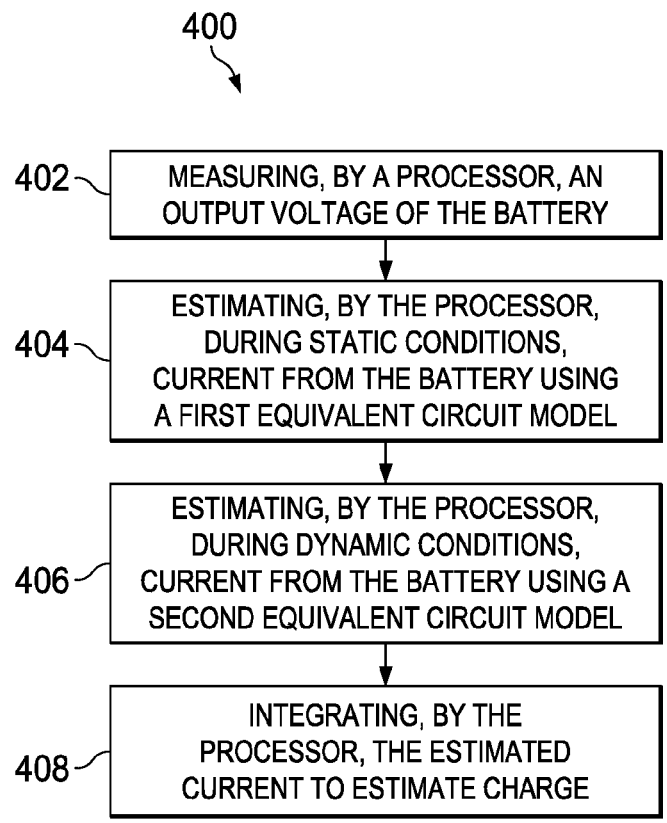
FIG. 4 is a flow chart of an example method estimating charge from a battery.

FIG. 4 illustrates an example method 400 of estimating charge from a battery. At step 402, a processor measures an output voltage of the battery. At step 404, during static conditions, the processor estimates current from the battery using a first equivalent circuit model. At step 406, during dynamic conditions, the processor estimates current from the battery using a second equivalent circuit model. At step 408, the processor integrates estimated current to estimate charge.

While illustrative and presently preferred embodiments of the invention have been described in detail herein, it is to be understood that the inventive concepts may be otherwise variously embodied and employed and that the appended claims are intended to be construed to include such variations except insofar as limited by the prior art.

What is claimed is:

1. A system, comprising:
   a battery;
   an analog-to-digital converter coupled to the battery and capable of measuring an output voltage of the battery;
   a processor, receiving measured battery output voltages from the analog-to-digital converter;
   the processor using a first equivalent circuit model of the battery to estimate battery current when the battery operation is static;
   the processor using a second equivalent circuit model of the battery to estimate battery current when the battery operation is dynamic, where the second equivalent circuit model comprises a voltage source, and a series resistor in series with at least one resistor in parallel with a capacitor where the first equivalent circuit model is used by the processor when an estimated voltage across the parallel resistor and capacitor is substantially constant, and where the second equivalent circuit model is used by the processor when the estimated voltage across the parallel resistor and capacitor is varying.

2. The system of claim 1 where the first equivalent circuit model comprises a voltage source and a single resistor.

3. The system of claim 2, where the resistance of the single resistor varies as a function of state of charge of the battery.

4. The system of claim 1, where the resistance of the series resistor and the resistance of the at least one resistor in parallel with a capacitor vary as a function of state of charge of the battery.

5. The system of claim 1, further comprising:
   the first equivalent circuit model comprises a voltage source and a single resistor and the resistance of the single resistor varies as a function of state of charge of the battery; and
   the second equivalent circuit model comprises a voltage source and a resistor in series with a first parallel resistor in parallel with a first capacitor, and in series with a second parallel resistor in parallel with a second capacitor, and the series resistor, the first parallel resistor, and the second parallel resistor vary as a function of state of charge of the battery.

6. The system of claim 1, further comprising:
a temperature sensor to measure the temperature of the battery;
the processor receiving the measurement of the temperature of the battery;
the first equivalent circuit model comprises a voltage source and a single resistor and the resistance of the single resistor varies as a function of temperature; and
the second equivalent circuit model comprises a voltage source and a resistor in series with a first parallel resistor in parallel with a first capacitor, and in series with a second parallel resistor in parallel with a second capacitor, and the resistances of the series resistor, the first parallel resistor, and the second parallel resistor vary as a function of temperature of the battery.

7. The system of claim 1, where circuit parameters in the first and second equivalent circuit models vary as a function of temperature of the battery and vary as a function of state of charge of the battery.

8. A system, comprising:
a battery;
an analog-to-digital converter coupled to the battery and capable of measuring an output voltage of the battery;
a processor, receiving measured battery output voltages from the analog-to-digital converter;
the processor using a first equivalent circuit model of the battery to estimate battery current when the battery operation is static; and
the processor using a second equivalent circuit model of the battery to estimate battery current when the battery operation is dynamic;
further comprising:
a temperature sensor to measure the temperature of the battery;
the processor receiving the battery temperature measurement;
where the first equivalent circuit model is used by the processor when an estimated voltage across the first parallel resistor and first capacitor is substantially constant, and the second equivalent circuit model is used by the processor when the estimated voltage across the first parallel resistor and first capacitor is varying and where the second equivalent circuit model comprises a voltage source and a series resistor in series with at least one resistor in parallel with a capacitor, where the resistance of the series resistor and the resistance of the at least one resistor in parallel with a capacitor vary as a function of temperature of the battery.

9. The system of claim 8, where the first equivalent circuit model consists of a voltage source and a single resistor and where the resistance of the single resistor varies as a function of temperature of the battery.

10. An integrated circuit, comprising:
an analog-to-digital converter couplable to a battery and capable of measuring an output voltage of the battery;
a processor, configured to receive measured output voltages from a battery;
the processor using a first equivalent circuit model of the battery to estimate battery current when the battery operation is static; and
the processor using a second equivalent circuit model of the battery to estimate battery current when the battery operation is dynamic,
where the second equivalent circuit model comprises a voltage source, and a series resistor in series with at least one resistor in parallel with a capacitor and where the first equivalent circuit model is used by the processor when an estimated voltage across the parallel resistor and capacitor is substantially constant, and the second equivalent circuit model is used by the processor when the estimated voltage across the parallel resistor and capacitor is varying.

11. A method of estimating state of charge of a battery, comprising:
measuring, by a processor, an output voltage of the battery;
estimating, by the processor, during static battery operation, current from the battery using a first equivalent circuit model;
estimating, by the processor, during dynamic battery operation, current from the battery using a second equivalent circuit model; and
integrating, by the processor, the estimated current to estimate state of charge of the battery;
further comprising:
calculating, by the processor, an estimated voltage across a first parallel R-C circuit in the second equivalent circuit model;
using, by the processor, the first equivalent circuit model to estimate current from the battery when the estimated voltage across the first parallel R-C circuit in the second equivalent circuit model is substantially constant; and
using, by the processor, the second equivalent circuit model to estimate current from the battery when the estimated voltage across a first parallel R-C circuit in the second equivalent circuit model is varying.

12. The method of claim 11, further comprising:
measuring, by a temperature sensor, temperature of the battery; and
varying, by the processor, resistances in the first and second equivalent circuit models as a function of temperature of the battery.

13. The method of claim 12, further comprising:
calculating, by the processor, an estimated voltage across a first parallel R-C circuit in the second equivalent circuit model;
using, by the processor, the first equivalent circuit model to estimate current from the battery when the estimated voltage across the first parallel R-C circuit in the second equivalent circuit model is substantially constant; and
using, by the processor, the second equivalent circuit model to estimate current from the battery when the estimated voltage across a first parallel R-C circuit in the second equivalent circuit model is varying.

14. The method of claim 11, further comprising:
varying, by the processor, resistances in the first and second equivalent circuit models as a function of state of charge of the battery.

15. The method of claim 14, further comprising:
calculating, by the processor, an estimated voltage across a first parallel R-C circuit in the second equivalent circuit model;
using, by the processor, the first equivalent circuit model to estimate current from the battery when the estimated voltage across the first parallel R-C circuit in the second equivalent circuit model is substantially constant; and
using, by the processor, the second equivalent circuit model to estimate current from the battery when the estimated voltage across a first parallel R-C circuit in the second equivalent circuit model is varying.

* * * * *